United States Patent
Jung

(10) Patent No.: US 9,878,678 B2
(45) Date of Patent: Jan. 30, 2018

(54) CAMERA MODULE FOR AUTOMOBILES

(71) Applicant: LG INNOTEK CO., LTD., Seoul (KR)

(72) Inventor: Sung Ki Jung, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 82 days.

(21) Appl. No.: 15/137,532

(22) Filed: Apr. 25, 2016

(65) Prior Publication Data

US 2016/0311380 A1    Oct. 27, 2016

(30) Foreign Application Priority Data

Apr. 24, 2015  (KR) .................. 10-2015-0057708

(51) Int. Cl.
| | |
|---|---|
| H04N 5/225 | (2006.01) |
| H04N 7/00 | (2011.01) |
| H04N 7/18 | (2006.01) |
| B60R 11/04 | (2006.01) |
| H05K 1/14 | (2006.01) |

(52) U.S. Cl.
CPC ........... *B60R 11/04* (2013.01); *H04N 5/2252* (2013.01); *H04N 5/2253* (2013.01); *H04N 5/2254* (2013.01); *H04N 5/2257* (2013.01); *H05K 1/144* (2013.01); *H05K 1/147* (2013.01); *H05K 1/148* (2013.01); *H05K 2201/041* (2013.01)

(58) Field of Classification Search
CPC .... B60R 11/04; H04N 5/2252; H04N 5/2253; H04N 5/2254; H04N 5/2257; H04N 5/2251; H05K 1/144; H05K 1/147; H05K 1/148; H05K 2201/041; H05K 2201/042; Y10T 156/1702; Y10T 29/53; Y10T 29/53261; G03B 2217/002

USPC ......... 348/113, 118, 143, 373–375; 396/542; 439/61, 62, 69, 76.1

See application file for complete search history.

(56) References Cited

U.S. PATENT DOCUMENTS

| | | | |
|---|---|---|---|
| 4,533,976 A | 8/1985 | Suwa | |
| 2008/0247751 A1* | 10/2008 | Lang | ............... G03B 17/00 396/542 |
| 2011/0199485 A1* | 8/2011 | Nakamura | ......... G02B 13/001 348/148 |

(Continued)

FOREIGN PATENT DOCUMENTS

| | | |
|---|---|---|
| EP | 0807976 A2 | 11/1997 |
| EP | 1641096 A1 | 3/2006 |

OTHER PUBLICATIONS

Extended European Search Report dated Aug. 24, 2016 in European Application No. 16166425.5.

*Primary Examiner* — Lin Ye
*Assistant Examiner* — Euel Cowan
(74) *Attorney, Agent, or Firm* — Saliwanchik, Lloyd & Eisenchenk

(57) ABSTRACT

A camera module for automobiles is disclosed. The camera module includes a lens unit, a housing, in front of which the lens unit is disposed, and a plurality of printed circuit boards disposed in the housing so as to be opposite the lens unit, wherein the housing is provided at the inner wall thereof with a plurality of steps, the steps being provided between the respective printed circuit boards so as to be spaced apart from each other for setting the distance between the respective printed circuit boards.

19 Claims, 7 Drawing Sheets

(56) References Cited

U.S. PATENT DOCUMENTS

| | | | |
|---|---|---|---|
| 2011/0242321 A1* | 10/2011 | Nakajima | G02B 7/021 348/148 |
| 2013/0110516 A1* | 5/2013 | Abulhaj | G10L 21/00 704/274 |
| 2014/0168507 A1* | 6/2014 | Renaud | H04N 5/2257 348/373 |
| 2014/0320657 A1 | 10/2014 | Han et al. | |

* cited by examiner

CAMERA MODULE FOR AUTOMOBILES

CROSS REFERENCE TO RELATED APPLICATION

This application claims priority under 35 U.S.C. §119 to Korean Patent Application No. 10-2015-0057708, filed Apr. 24, 2015, which is hereby incorporated in its entirety.

TECHNICAL FIELD

Embodiments relate to a camera module for automobiles.

BACKGROUND

In this section, the following description merely provides information regarding the background of embodiments, and does not constitute the conventional art.

A camera module may be mounted in an automobile for various purposes. For example, an automobile may be provided at the rear part thereof with a camera module for securing a visual field at the rear of the automobile when the automobile is parked.

In addition, a camera module may also be used in a black box for automobiles, which is very useful in retracing the details of a traffic accident, including the cause of the accident. Furthermore, a camera module has been increasingly used as a recognition device for easily and clearly recognizing the situation in a blind spot, which a driver or a passenger in an automobile cannot easily check with the naked eye.

In recent years, smart cars, i.e. automobiles each equipped with a collision warning system for warning of the possibility of a collision in front of the automobile or to the rear of the automobile while the automobile is being driven or a collision avoidance system for directly avoiding a collision between the automobile and other automobiles running beside the automobile under the control of a controller mounted in the automobile, rather than based on the driving of a driver, have been increasingly manufactured, and related technologies have been increasingly developed.

A camera module has been increasingly used as a means for recognizing the situation outside such a smart car. As a result, camera modules for automobiles have been increasingly developed and manufactured.

The camera module for automobiles may include a plurality of printed circuit boards (PCBs), which may be spaced apart from each other by a predetermined distance.

Parts or devices, such as an image sensor, a condenser, a rectifier, and a transformer, having predetermined volumes, may be mounted in, installed in, or coupled to the respective boards. As a result, a predetermined distance is provided between the respective boards. For this reason, it is necessary to provide a device for keeping the distance between the respective boards uniform even when external impact or vibration is applied to the camera module.

In general, coupling members, such as bolts or screw nails, may be used to dispose the respective boards in the camera module at uniform intervals. However, holes, through which the coupling members are to be inserted, must be formed in the respective boards in order to use the coupling members. As a result, the size of the space in each of the boards, in which parts, devices, and circuits are mounted or formed, may be reduced.

In addition, when the coupling members are used, the boards may be damaged or bent during the assembly of the camera module due to pressure applied from the coupling members, with the result that the camera module may be incorrectly assembled.

BRIEF SUMMARY

Embodiments provide a camera module for automobiles configured to have a structure in which printed circuit boards are disposed so as to be spaced apart from each other by a predetermined distance without using an additional coupling member, such as bolt.

In one embodiment, a camera module for au mobiles includes a lens unit, a housing, in front of which the lens unit is disposed, and a plurality of printed circuit boards disposed in the housing an as to be opposite the lens unit, wherein the housing is provided at the inner wall thereof with a plurality of steps, the steps being provided between the respective printed circuit boards so as to be spaced apart from each other for setting the distance between the respective printed circuit boards.

In another embodiment, a camera module for automobiles includes a lens unit, a housing, to the front of which the lens unit is coupled, a plurality of printed circuit boards disposed in the housing so as to be opposite the lens unit, a plurality of steps formed at the inner wall of the housing such that the steps are provided between the respective printed circuit boards so as to be spaced apart from each other for setting the distance between the respective printed circuit boards, and a plurality of protrusions, each of the protrusions being opposite one end of a corresponding one of the steps, for maintaining a state of contact between one surface of each of the printed circuit boards and the one end of a corresponding one of the steps.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
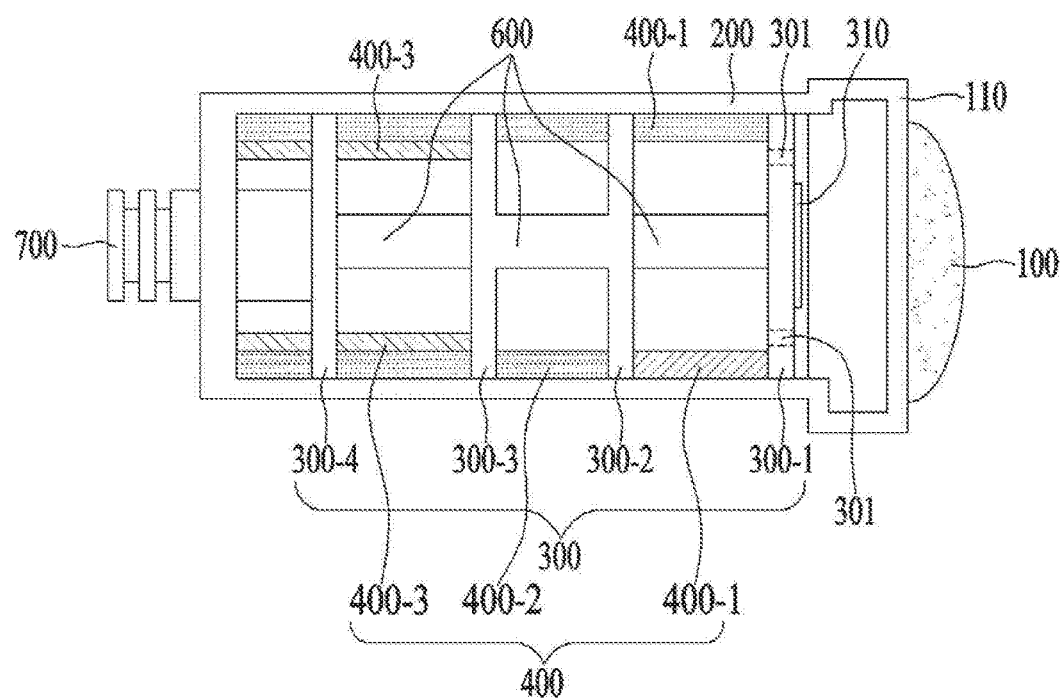
FIG. 1 is a side sectional view showing a camera module for automobiles according to an embodiment.

Reference will now be made in detail to the preferred embodiments, examples of which are illustrated in the accompanying drawings. While the disclosure is susceptible to various modifications and alternative forms, specific embodiments thereof are shown by way of example in the drawings. However, the disclosure should not be construed as limited to the embodiments set forth herein, but on the contrary, the disclosure is to cover all modifications, equivalents, and alternatives falling within the spirit and scope of the embodiments. In the drawings, sizes and shapes of elements may be exaggerated for convenience and clarity of description.

It may be understood that, although the terms "first," "second," etc. may be used herein to describe various elements, these elements should not be limited by these terms. These terms are generally only used to distinguish one element from another. In addition, terms particularly defined in consideration of construction and operation of the embodiments are used only to describe the embodiments, but do not define the scope of the embodiments.

It will be understood that when an element is referred to as being "on" or "under" another element, it can be directly on/under the element, and one or more intervening elements may also be present. When an element is referred to as being "on" or "under," "under the element" as well as "on the element" can be included based on the element.

In addition, relational terms, such as "on/upper part/above" and "under/lower part/below," are used only to distinguish between one subject or element and another subject and element without necessarily requiring or involving any physical or logical relationship or sequence between such subjects or elements.

Furthermore, in the drawings, a rectangular coordinate system (x, y, z) may be used, in the drawings, the x-axis and the y-axis are axes perpendicular to an optical axis. For the sake of convenience, an optical axis (z-axis) direction may be referred to as a first dire an x-axis direction may be referred to as a second direction, and a y-axis direction may be referred to as a third direction.

Figure 2:
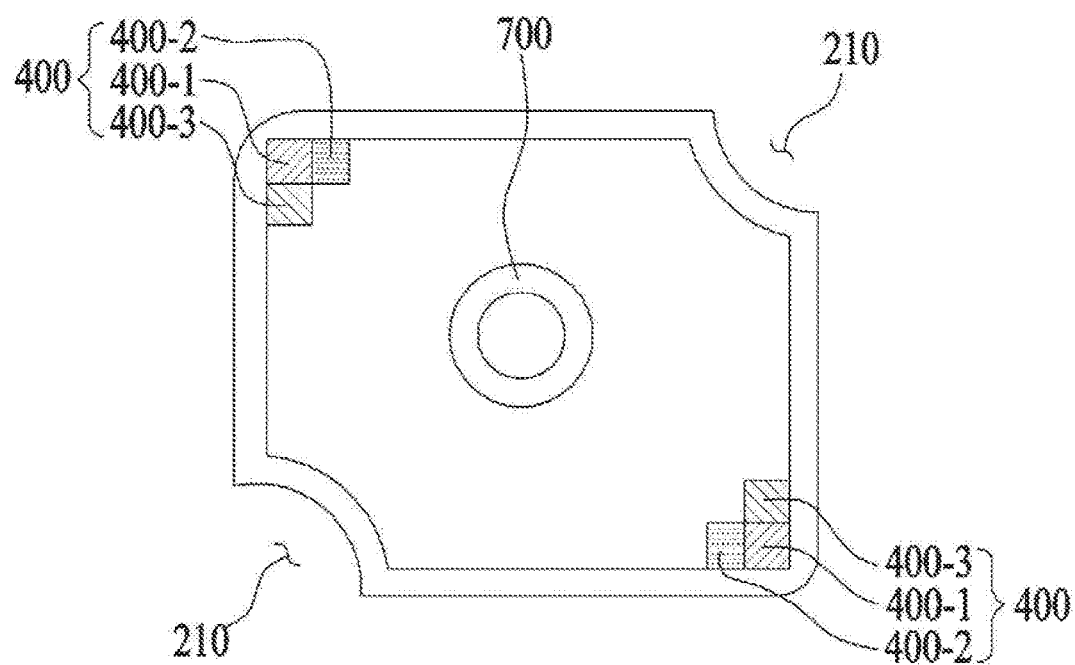
FIG. 2 is a front sectional view showing the camera module for automobiles according to the embodiment.
Figure 7:
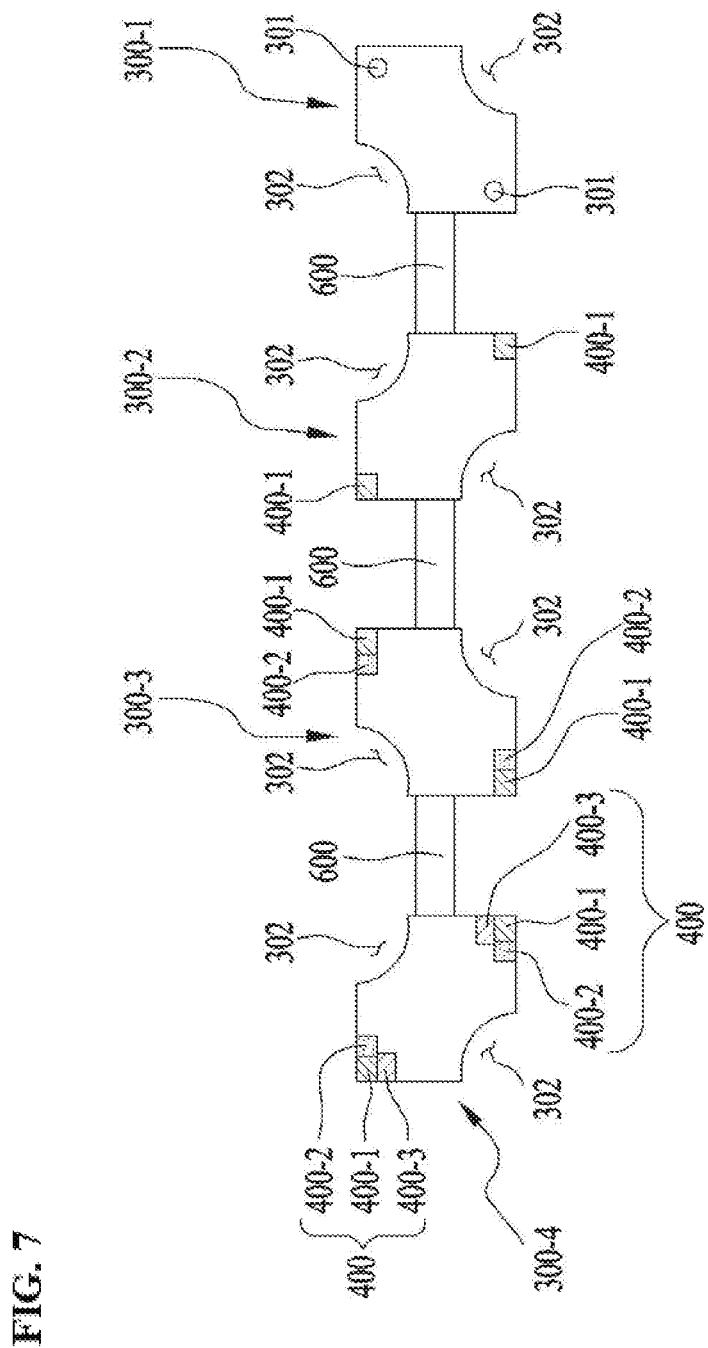
FIG. 7 is a view showing printed circuit boards according to an embodiment coupled to connectors.

FIG. 1 is a side sectional view showing a camera module for automobiles according to an embodiment. FIG. 2 is a front sectional view showing the camera module for automobiles according to the embodiment. FIG. 7 is a view showing printed circuit boards 300 according to an embodiment coupled to connectors 600. For clarity of description, the printed circuit boards 300 are omitted from FIG. 2.

The camera module fir automobiles according to the embodiment may include a lens unit 100, a housing 200, a front cover 110, printed circuit boards 300, connectors 600, and a cable connection part 700.

The lens unit 100 is a region on which light containing an image of an external subject is incident. The lens unit 100 may include a lens barrel, in which at least one lens is mounted. The lens barrel may be configured such that a single lens is mounted in the lens barrel. Alternatively, the lens barrel may be configured such that a plurality of lenses is arranged in the lens barrel in an optical direction, i.e. in a first direction.

The lens unit 100 may be coupled to the front cover 110 by shape fitting or interference fitting. For this reason, the camera module may further include a sealing member (not shown) for preventing moisture, dust, and other foreign matter from being introduced into the camera module through a space between the lens unit 100 and the front cover 110.

The lens unit 100 may be mounted to the front of the front cover 110. To this end, a hollow part (not shown), in which the lens unit 100 is mounted, may be formed in the front of the front cover 110. The front cover 110 may be coupled to the housing 200 at the rear thereof. The front cover 110 may be coupled to the housing 200, for example, using a coupling member (not shown).

To this end, a hole may be formed in the housing 200, and a recess may be formed in a region of the front cover 110 corresponding to the hole formed in the housing 200.

In this case, an escape part 210 may be formed in the housing 200 such that the coupling member is easily fastened to the front cover 110 through the housing 200. For stable coupling between the housing 200 and the front cover 110, as shown in FIG. 2, a pair of escape parts 210 may be formed in diagonal corners of the housing 200 when viewing a lateral section of the housing 200.

However, the disclosure is not limited thereto. In another embodiment, the coupling structure between the housing 200 and the front cover 110, which are coupled to each other using the coupling member, may be changed, or the escape parts 210 may not be formed in a case in which the front cover 110 is coupled to the housing 200 by shape fitting or interference fitting without using the coupling member.

The lens unit 100 may be disposed in front of the housing 100. In this case, the front cover may be disposed between the housing 200 and the lens unit 100.

The housing 200 is coupled to the front cover 110 for accommodating most components of the camera module in a state in which the components of the camera module are isolated from the outside to prevent damage to or malfunction of the components of the camera module due to external impact and to prevent moisture, dust, and other foreign matter from being introduced into the camera module.

The cable connection part 700 may be provided at the rear of the housing 200. The cable connection part 700 may electrically connect the camera module to an external cable. Power from an external source may be supplied to the camera module, or the camera module may transmit or receive an electrical signal to or from an external device, through a cable (not shown) extending through the cable connection part 700.

As shown in FIG. 1, the cable connection part 700 may be coupled, for example, to a fourth board 300-4, which is disposed in the housing 200 at the rearmost end of the housing 200. As a result, the cable may be coupled to the fourth board 300-4.

A plurality of printed circuit boards 300 may be arranged in the housing 200 so as to be opposite the lens unit 100. In an embodiment shown in FIG. 1, four printed circuit boards 300 are provided. However, the disclosure is not limited thereto. In another embodiment, less than four printed circuit boards 300 or more than four printed circuit boards 300 may be provided. In a further embodiment, a single printed circuit board 300 may be provided.

Hereinafter, the printed circuit boards 300 shown in FIG. 1 will be described. As shown in FIG. 1, the printed circuit boards 300 may include a first board 300-1, a second board 300-2, a third board 300-3, and a fourth board 300-4. The boards may be arranged so as to be spaced apart from each other by a plurality of steps 400, i.e. a first step 400-1, a second step 400-2, and a third step 400-3. The structures of the steps 400 and the boards will be described hereinafter.

The first board 300-1 may be disposed in the housing 200 such that one surface of the first board 300-1 contacts one end of the first step 400-1. The first board 300-1 may be disposed adjacent to the lens unit 100 while being opposite the lens unit 100. The first board 300-1 may include an image sensor 310 mounted in the front surface thereof so as to constitute an electromagnetic circuit including various circuit devices.

The image sensor 310 may sense an image of a subject incident on the lens unit 100, convert the sensed image into an electrical signal, and transmit the electrical signal to an external image storage device or an external image reproduction device. Conversion of the sensing image into the electrical signal may be performed by the other boards.

The second board 300-2 may be disposed in the housing 200 such that one surface of the second board 300-2 contacts one end of the second step 400-2. The second board 300-2 may be disposed between the first board 300-1 and the third board 300-3. The second board 300-2 may be electrically connected to the first board 300-1 and the third board 300-3 so as to constitute an electromagnetic circuit.

The third board 300-3 may be disposed in the housing 200 such that one surface of the third board 300-3 contacts one end of the third step 400-3. The third board 300-3 may be disposed between the second board 300-2 and the fourth board 300-4. The third board 300-3 may be electrically connected to the second board 300-2 and the fourth board 300-4 so as to constitute an electromagnetic circuit.

The second board 300-2 and the third board 300-3 may serve as an electrical channel for supplying necessary power to the first board 300-1. In addition, the second board 300-2 and the third board 300-3 may transmit an electrical signal regarding the sensed image, transmitted from the first board 300-1, to the external image storage device or the external image reproduction device.

For example, the second board 300-2 and/or the third board 300-3 may convert the sensed image, transmitted from the first board 300-1, into an electrical signal, and may transmit the electrical signal to the external image storage device or the external image reproduction device. In addition, the second board 300-2 and/or the third board 300-3 may rectify power supplied from the fourth board 300-4, and may transmit the rectified power to the first board 300-1.

That is, the second board 300-2 and/or the third board 300-3 may be disposed between the first board 300-1 and the fourth board 300-4 for partially performing roles of the first board 300-1 and the fourth board 300-4.

The fourth board 300-4 may be disposed at the third step 4003 so as to be spaced apart from the third board 300-3 in the longitudinal direction of the housing 200. As shown in FIG. 1, the fourth board 300-4 may be directly connected to the cable connection part 700 and the cable.

The fourth board 300-4 may receive power necessary to operate the camera module from an external source, and transmit the power to the first board 3004, the second board 300-2, and the third board 300-3. In addition, the fourth board 300-4 may transmit an electrical signal corresponding to the sensed image, transmitted from the first board 300-1, the second board 300-2, and the third board 300-3, to the external image storage device or the external image reproduction device.

To this end, various devices, such as a condenser, a rectifier, and a transformer, for supplying power having appropriate voltage and current necessary to operate the camera module may be mounted in the fourth board 300-4. In addition, the cable connection part 700 and one end of the cable may be coupled to the fourth board 300-4 such that the fourth board 300-4 is electrically connected to the external image storage device, the external image reproduction device, or an external camera module control device.

The connectors 600 may electrically interconnect the printed circuit boards 300, i.e. the first board 300-1, the second board 300-2, the third board 300-3, and the fourth board 300-4. Since the connectors 600 electrically interconnect the respective boards, the number of connectors 600 may be one less than the number of printed circuit boards 300.

Referring to FIGS. 1 and 7, in the embodiment, the printed circuit boards 300 include the first board 300-1, the second board 300-2, the third board 300-3, and the fourth board 300-4, i.e. the number of printed circuit boards 300 is four. Consequently, the number of connectors 600 may be three, which is one less than the number of printed circuit boards 300.

Referring to FIGS. 1 and 7, in the embodiment, the connectors 600, which interconnect the respective boards, are provided such that each of the connectors 600 is disposed at one side of a corresponding one of the boards. However, the disclosure is not limited thereto. The number and position of connectors 600 may be set in consideration of the circuit structure of each of the boards and the overall structure of the camera module.

The connectors 600 may be made of a flexible material that can be easily coupled to the respective boards and that can absorb impact or vibration applied to the camera module from outside. For example, each of the connectors 600 may be formed using a flexible circuit board.

However, the disclosure is not limited thereto. The connectors 600 may be made of any rigid material as long as the connectors 600 exhibit high resistance to impact or vibration. For example, each of the connectors 600 may be formed using an electric wire.

In addition, soldering, bonding using an electrically conductive adhesive, shape fitting, interference fitting, or the like may be used in order to couple the connectors 600 to the respective boards. The connectors 600 may be board-to-board (B2B) connectors for electrically interconnecting the respective boards.

Meanwhile, the connectors 600 and the respective boards may be arranged in series. In a case in which the boards are disposed in the housing 200, the connectors 600 may be arranged in a zigzag pattern when viewed from the paper in the vertical direction in FIG. 1.

Since parts or devices, such as the image sensor 310, the condenser, the rectifier, and the transformer, having predetermined volumes are mounted in, installed in, or coupled to the first board 300-1, the second board 300-2, the third board 300-3, and the fourth board 300-4, as described above, a predetermined distance is provided between the respective boards. For this reason, a device for keeping the distance between the respective boards uniform even when impact or vibration is applied to the camera module may be provided.

In general, coupling members, such as bolts or screw nails, may be used to dispose the respective boards in the housing 200 at uniform intervals. However, holes, through which the coupling members are to be inserted, must be formed in the respective boards in order to use the coupling members. As a result, the size of the space in each of the boards, in which the parts, devices, and circuits are mounted or formed, may be reduced.

In addition, when the coupling members are used, the boards may be damaged or bent during the assembly of the camera module due to pressure applied from the coupling members, with the result that the camera module may be incorrectly assembled.

In this embodiment, therefore, in order to solve the above problems, steps 400 and protrusions 500 may be formed at the housing 200 such that at least some of the boards are coupled to the steps 400 and the protrusions 500 by interference fitting.

The steps 400 may be formed on the inner wall of the housing 200 such that the steps 400 are provided between the printed circuit boards 300 so as to be spaced apart from each other, the steps 400 being arranged to set the distances between the respective printed circuit boards 300.

Referring to FIG. 1, the steps 400 may be formed on the inner wall of the housing 200 such that the steps 400 have predetermined widths in the lateral direction of the housing 200 and different lengths in the longitudinal direction of the housing 200.

In addition, the steps 400 may be arranged such that one end of each of the steps 400 contacts one surface of a corresponding one selected from among the first board 3004, the second board 300-2, and the third board 300-3 in a state in which the steps 400 are spaced apart from each other in the longitudinal direction of the housing 200.

The distance between at least some of the printed circuit boards 300 may be set based on the distance between corresponding ends of the steps 400.

Specifically, the steps 400 may include a first step 400-1, a second step 400-2, and a third step 400-3. The distance between the first board 300-1 and the second board 300-2 may be set based on the distance between one end of the first step 400-1 and one end of the second step 400-2 in the longitudinal direction of the housing.

In addition, the distance between the second board 300-2 and the third board 300-3 may be set based on the distance between one end of the second step 400-2 and one end of the third step 400-3 in the longitudinal direction of the housing 200. However, the distance between the respective boards may be different from the distance between the respective steps 400 due to the thickness of the boards and other structures of the camera module.

Meanwhile, as shown in FIGS. 1 and 2, each of the steps 400 may have a quadrangular shape in section. Since each of the steps 400 has a quadrangular shape in section, the steps 400 may be arranged as follows.

The steps 400 may include a first step 400-1, a second step 400-2, and a third step 400-3. In one embodiment, the steps 400 may be integrally formed on the inner wall of the housing 200 by injection molding. Of course, the first step 400-1, the second step 400-2, and the third step 400-3 may be integrally formed.

As shown in FIGS. 1 and 2, the first step 400-1 may be formed on a corner of the inner wall of the housing 200 such that the first step 400-1 extends in the longitudinal direction of the housing 200. The first step 400-1 may be longer than the second step 400-2 and the third step 400-3 in the longitudinal direction of the housing 200. One surface of the first board 300-1 may contact one end of the first step 400-1.

The second step 400-2 may be disposed at one side of the first step 400-1 such that the second step 400-2 extends in the longitudinal direction of the housing 200. The second step 400-2 may be longer than the third step 400-3 in the longitudinal direction of the housing 200. One surface of the second board 300-2 may contact one end of the second step 400-2.

As shown in FIG. 2, the third step 400-3 may be disposed at the other side of the first step 400-1 such that the third step 400-3 is perpendicular to the second step 400-2 on the basis of the first step 400-1. The third step 400-3 may extend in the longitudinal direction of the housing 200. The third step 400-3 may be shorter than the first step 400-1 and the second step 400-2 in the longitudinal direction of the housing 200. One surface of the third board 300-3 may contact one end of the third step 400-3.

Consequently, the first step 400-1 may be longer than the second step 400-2, and the second step 400-2 may be longer than the third step 400-3, in the longitudinal direction of the housing 200.

Meanwhile, the steps 400 need to stably support the respective boards. To this end, the steps 400 may be provided at diagonal corners of the inner wall of the housing 200 when viewing a lateral section of the housing 200, as shown in FIG. 2.

Consequently, the printed circuit boards 300 may be stably supported at two diagonal positions by the steps 400.

Figure 3:
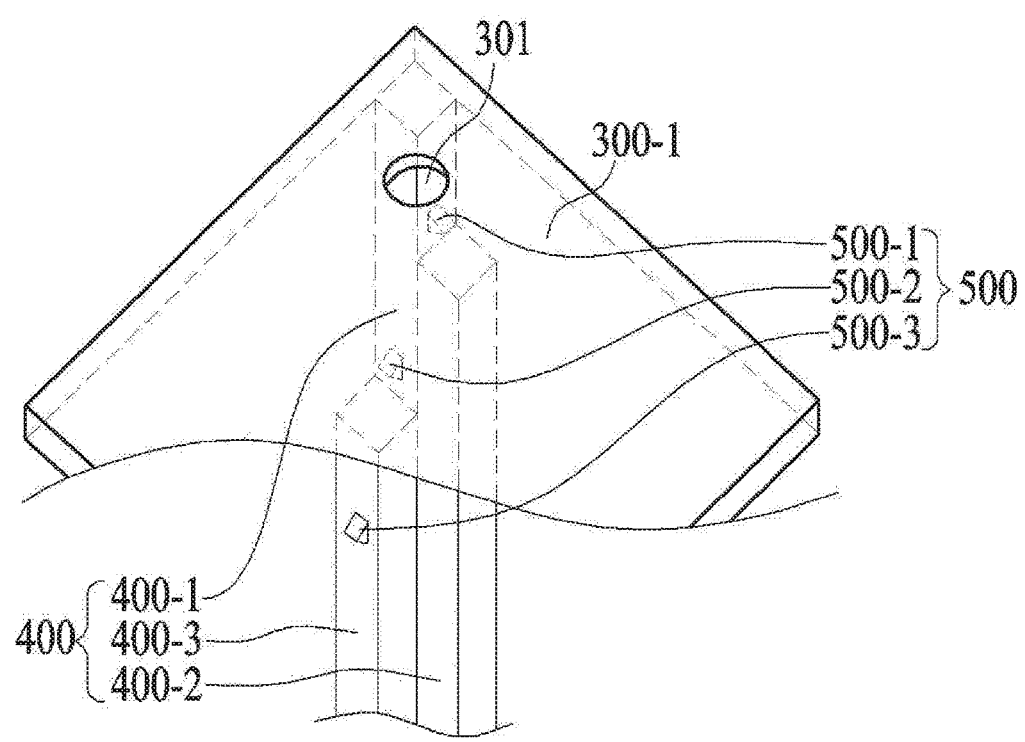
FIG. 3 is a view showing a first board according to an embodiment mounted in a housing.

FIG. 3 is a view showing a first board 300-1 according to an embodiment mounted in the housing 200. As shown in FIG. 3, the first board 300-1 may be disposed in the housing 200 such that one surface of the first board 300-1 contacts one end of the first step 400-1.

The movement of the first board 300-1 toward the rear of the housing 200 is restricted by one end of the first step 400-1, which serves as a stopper. As a result, the position of the first board 300-1 may be maintained uniform by the first step 400-1, whereby the distance between the first board 300-1 and the second board 300-2 may be maintained uniform.

Meanwhile, as shown in FIGS. 1 and 3, a through hole 301 may be formed in the first board 300-1. A coupling member (not shown) is inserted through the through hole 301 so as to couple the lens unit to the first board 300-1.

In order to more stably couple the lens unit to the first board 300-1, as shown in FIGS. 1 and 7, a pair of coupling members may be provided at diagonal positions when viewed in the lateral direction of the first board 300-1. The coupling members may be inserted through respective through holes 301 so as to stably couple the lens unit to the first board 300-1.

In a case in which the lens unit is coupled to the first board 300-1 using another method, for example, using an adhesive, such as epoxy, the coupling members may not be used, with the result that the through holes 301 may not be formed in the first board 300-1.

Meanwhile, in order to prevent damage to or dislocation of the first board 300-1 due to external impact, the first board 300-1 needs to be more securely mounted in the housing 200. To this end, the first board 300-1 may be bonded to one end of the first step 400-1. In this case, epoxy, a thermosetting adhesive, a UV-curable adhesive, or the like may be used as an adhesive for bonding.

Figure 4:
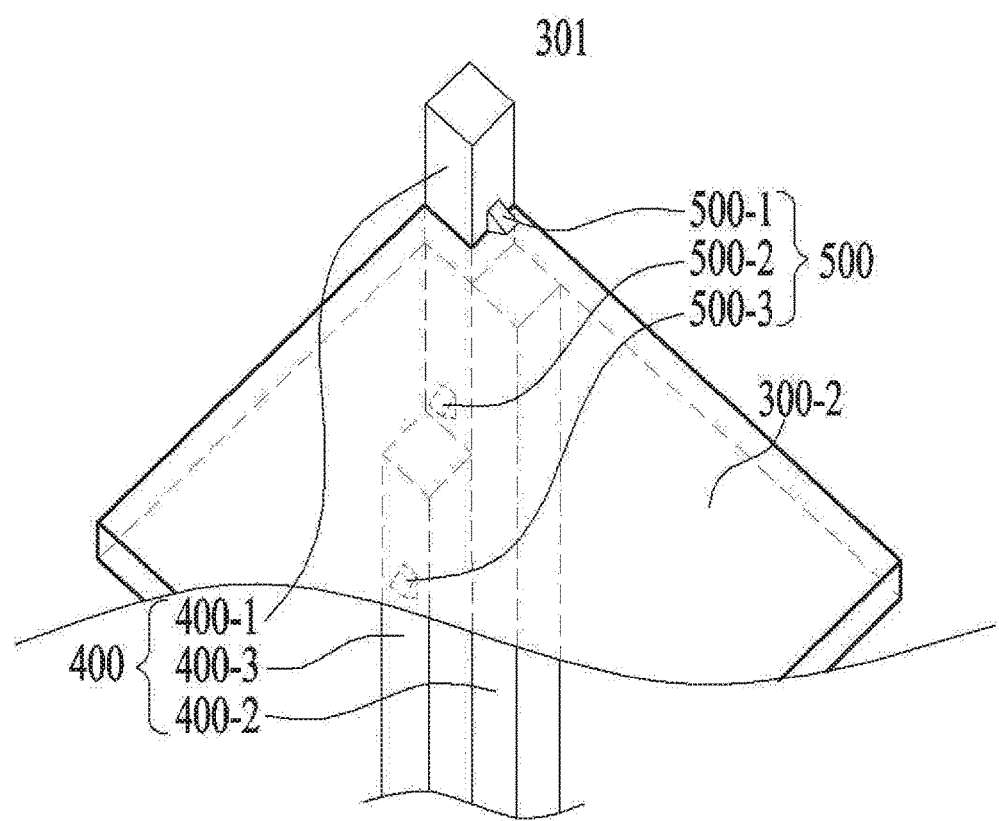
FIG. 4 is a view showing a second board according to an embodiment mounted in the housing.

FIG. 4 is a view showing a second board 300-2 according to an embodiment mounted in the housing 200. The second board 300-2 may be disposed in the housing 200 such that one surface of the second board 300-2 contacts one end of the second step 400-2.

The movement of the second board 300-2 toward the rear of the housing 200 is restricted by one end of the second step 400-2, which serves as a stopper. In addition, the movement of the second board 300-2 toward the front of the housing 200 is restricted by a first protrusion 500-1, which serves as another stopper.

As a result, the position of the second board 300-2 may be maintained uniform by the second step 400-2 and the first protrusion 500-1, whereby the distance between the second board 300-2 and the first board 300-1 and between the second board 300-2 and the third board 300-3 may be maintained uniform. In this case, the second board 300-2 may be fitted between one end of the second step 400-2 and the first protrusion 500-1 by interference fitting.

The first protrusion 500-1 may be formed at one side of the first step 400-1 so as to be opposite one end of the second step 400-2. The first protrusion 500-1 may maintain a state of contact between one surface of the second board 300-2 and one end of the second step 400-2. In the same manner as the second step 400-2, a pair of first protrusions 500-1 may be provided at diagonal positions when viewing a lateral section of the housing 200.

As shown in FIG. 4, the second board 300-2 may be fitted between the first protrusion 500-1 and one end of the second step 400-2 by interference fitting such that the position of the second board 300-2 in the housing 200 is maintained uniform.

Meanwhile, in order to prevent damage to or dislocation of the second board 300-2 due to external impact, the second board 300-2 needs to be more securely mounted in the housing 200. To this end, the second board 300-2 may be coupled between the first protrusion 500-1 and one end of the second step 400-2 by bonding. In this case, epoxy, a thermosetting adhesive, a UV-curable adhesive, or the like may be used as an adhesive for bonding.

Figure 5:
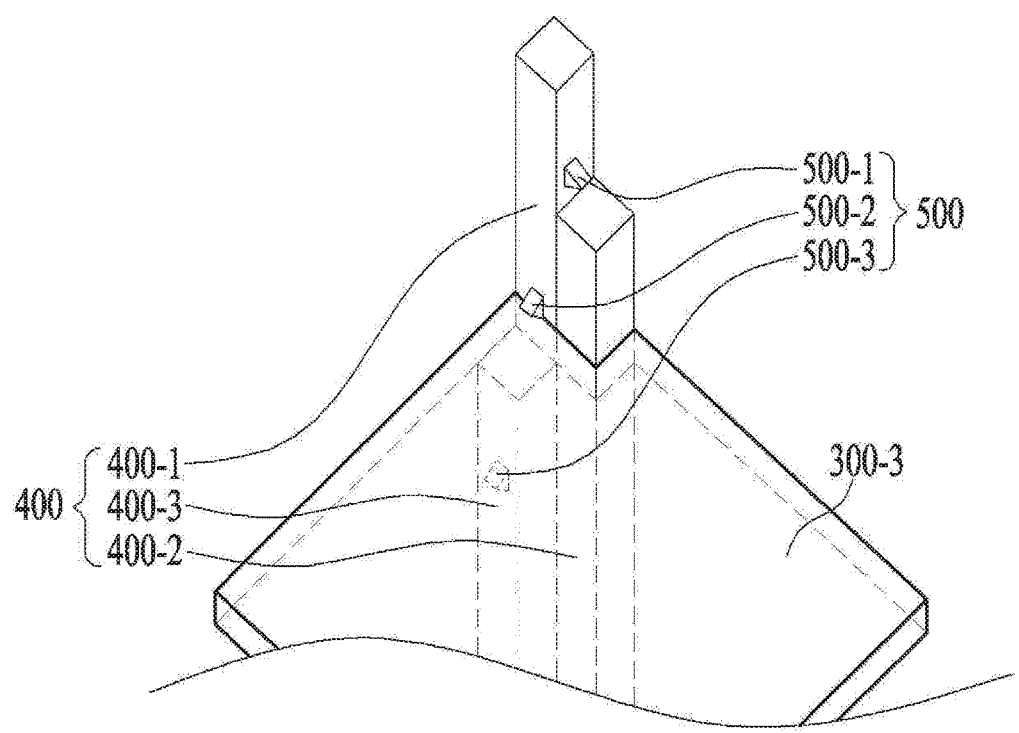
FIG. 5 is a view showing a third board according to an embodiment mounted in the housing.

FIG. 5 is a view showing a third board 300-3 according to an embodiment mounted in the housing 200. The third board 300-3 may be disposed in the housing 200 such that one surface of the third board 300-3 contacts one end of the third step 400-3.

The movement of the third board 300-3 toward the rear of the housing 200 is restricted by one end of the third step 400-3, which serves as a stopper. In addition, the movement of the third board 300-3 toward the front of the housing 200 is restricted by a second protrusion 500-2, which serves as another stopper.

As a result, the position of the third board 300-3 may be maintained uniform by the third step 400-3 and the second protrusion 500-2, whereby the distance between the third board 300-3 and the second board 300-2 and between the second board 300-2 and the fourth board 300-4 may be maintained uniform. In this case, the third board 300-3 may be fitted between one end of the third step 400-3 and the second protrusion 500-2 by interference fitting.

The second protrusion 500-2 may be formed at one side of the first step 400-1 or the second step 400-2 so as to be opposite one end of the third step 400-3. The second protrusion 500-2 may maintain a state of contact between one surface of the third board 300-3 and one end of the third step 400-3.

In the same manner as the third step 400-3, a pair of second protrusions 500-2 may be provided at diagonal positions when viewing a lateral section of the housing 200.

Figure 6:
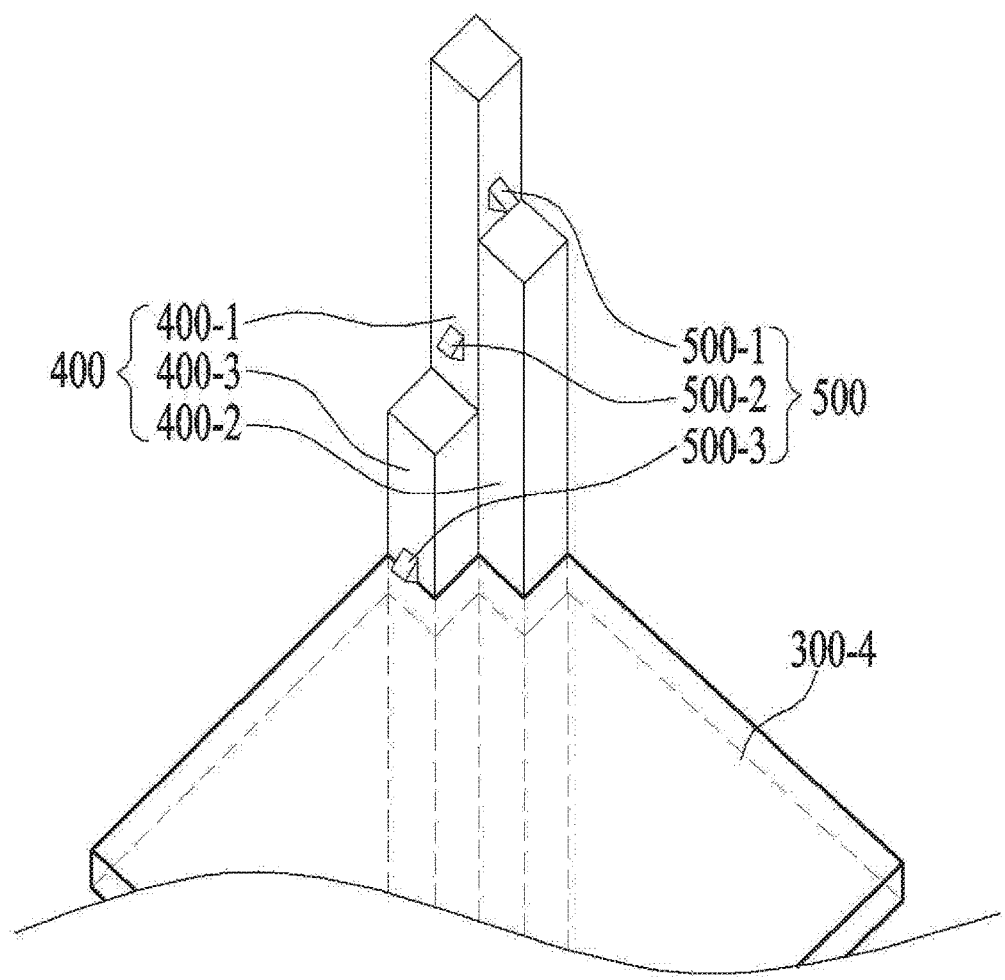
FIG. 6 is a view showing a fourth board according to an embodiment mounted in the housing.

In FIGS. 4 to 6, in one embodiment, the second protrusion 500-2 is formed at one side of the first step 400-1. In another embodiment, the second protrusion 500-2 may be formed at one side of the second step 400-2. In a further embodiment, the second protrusion 500-2 may be formed at the boundary between the first step 400-1 and the second step 400-2.

As shown in FIG. 5, the third board 300-3 may be fitted between the second protrusion 500-2 and one end of the third step 400-3 by interference fitting such that the position of the third board 300-3 in the housing 200 is maintained uniform.

Meanwhile, in order to prevent damage to or dislocation of the third board 300-3 due to external impact, the third board 300-3 needs to be more securely mounted in the housing 200. To this end, the third board 300-3 may be coupled between the second protrusion 500-2 and one end of the third step 400-3 by bonding. In this case, epoxy, a thermosetting adhesive, a UV-curable adhesive, or the like may be used as an adhesive for bonding.

FIG. 6 is a view showing a fourth board 300-4 according to an embodiment mounted in the housing 200. The fourth board 300-4 may be disposed in the housing 200 such that one surface of the fourth board 300-4 contacts one surface of a third protrusion 500-3.

The movement of the fourth board 300-4 toward the front of the housing 200 is restricted by the third protrusion 500-3, which serves as a stopper. The third protrusion 500-3 may be formed at one side of the third step 400-3 such that one surface of the third protrusion 500-3 contacts one surface of the fourth board 300-4.

The fourth board 300-4 needs to maintain contact with one surface of the third protrusion 500-3 at a constant position of the fourth board 300-4. To this end, the fourth board 300-4 and the third protrusion 500-3 may be coupled to each other by bonding. In this case, epoxy, a thermosetting adhesive, a UV-curable adhesive, or the like may be used as an adhesive for bonding.

In order to maintain the position of the fourth board 300-4, in another embodiment, a fourth protrusion (not shown) may be formed at one side of the third step 400-3 so as to protrude toward the rear of the third protrusion 500-3. The fourth board 300-4 may be coupled between the third protrusion 500-3 and the fourth protrusion such that the position of the fourth board 300-4 is maintained uniform.

In addition, in order to maintain the position of the fourth board 300-4, in a further embodiment, a fourth step (not shown) may be formed at one side of the third step 400-3 so as to have a shorter length than the third step 400-3. The fourth board 300-4 may be coupled between the third protrusion 500-3 and one end of the fourth step such that the position of the fourth board 300-4 is maintained uniform.

Meanwhile, as shown in FIGS. 4 to 6, the first protrusion 500-1, the second protrusion 500-2, and the third protrusion 500-3 may be configured such that the front surfaces of the protrusions are inclined to the sides of the respective steps 400 and the rear surfaces of the protrusions are perpendicular or almost perpendicular to the sides of the respective steps 400 when viewed in the frontward direction of the housing 200.

When the respective boards are disposed in the housing 200, therefore, the boards may be pushed toward the rear of the housing 200, whereby the boards may easily pass through the inclined front surfaces of the respective protrusions 500.

After the respective boards are located at predetermined positions, the perpendicular or almost perpendicular rear surfaces of the respective protrusions 500 serve as stoppers, with the result that the boards are prevented from moving toward the front of the housing 200.

Due to the structures of the first protrusion 500-1, the second protrusion 500-2, and the third protrusion 500-3, the respective boards are easily mounted in the housing 200, and are prevented from escaping from the positions at which the respective boards are mounted after being mounted in the housing 200.

FIG. 7 is a view showing printed circuit boards 300 according to an embodiment coupled to the connectors 600.

The respective boards may be provided at corners thereof with holes, through which the first step 400-1, the second step 400-2, and the third step 400-3 extend. The holes may have shapes corresponding to the sectional shapes of the first step 400-1, the second step 400-2, and the third step 400-3. The holes in the respective boards may have different shapes based on the number of steps 400 that extend through the respective boards.

That is, as shown in FIG. 7, the steps 400 are not formed in the first board 300-1, with the result that no holes may be formed in the first board 3004. Only a pair of first steps 400-1 extends through the second board 300-2, with the result that holes, through which the first steps 400-1 extend, may be formed in the second board 300-2.

A pair of first steps 400-1 and a pair of second steps 400-2 extend through the third board 300-3, with the result that holes, through which the first steps 400-1 and the second steps 400-2 extend, may be formed in the third board 300-3.

A pair of first steps 400-1, a pair of second steps 400-2, and a pair of third steps 400-3 extend through the fourth board 300-4, with the result that holes, through which the first steps 400-1, the second steps 400-2, and the third steps 400-3 extend, may be formed in the fourth board 300-4.

In addition, depressions 302 may be formed in the respective boards. The depressions 302 may be formed in corners of the printed circuit boards 300 at which no steps 400 are formed when viewing a lateral section of the housing 200.

Since the escape parts 210 are formed in the housing 200, as shown in FIG. 2, the depressions 302 may be formed such that the boards can be mounted in the housing 200 while avoiding the escape parts 210.

Since a pair of escape parts 210 is formed diagonally, a pair of depressions 302 may be provided in diagonal positions of the housing 200 when viewing a lateral section of the housing 200 such that the depressions 302 correspond to the escape parts 210.

Meanwhile, since the respective boards and the connectors 600 are connected to each other in series and are mounted in the housing 200 in a zigzag pattern, as described above, the holes, the depressions 302, and the overall structures of the respective boards may be configured as shown in FIG. 7.

As is apparent from the above description, in the camera module for automobiles according to an embodiment, the distance between the respective boards is maintained uniform without using coupling members, such as bolts. As a result, it is not necessary to form holes, through which the coupling members are inserted, in the respective boards. Consequently, it is possible to increase the size of the space in each of the boards in which parts, devices, and circuits are mounted or formed.

In addition, even in a case in which the coupling members are used, it is possible to prevent incorrect assembly of the camera module due to damage to or bending of the boards which may be caused by pressure applied from the coupling members during assembly of the camera module.

Furthermore, no coupling members are used when the boards are mounted in the camera module, thereby reducing the cost of manufacturing the camera module.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A camera module for automobiles comprising:
 a lens unit;
 a housing, in front of which the lens unit is disposed; and
 a plurality of printed circuit boards disposed in the housing so as to be opposite the lens unit, wherein
 the housing is provided at an inner wall thereof with a plurality of steps, the steps being provided between the respective printed circuit boards so as to be spaced apart from each other for setting a distance between the respective printed circuit boards,
 wherein the steps further comprise;
 a first step;
 a second step disposed at one side of the first step; and
 a third step disposed at the other side of the first step such that the third step is perpendicular to the second step on a basis of the first step.

2. The camera module according to claim 1, wherein the steps are formed on the inner wall of the housing such that the steps have predetermined widths in a lateral direction of the housing and different lengths in a longitudinal direction of the housing.

3. The camera module according to claim 2, wherein the steps are arranged so as to be spaced apart from each other in the longitudinal direction of the housing such that one end of each of the steps contacts one surface of a corresponding one of the printed circuit boards.

4. The camera module according to claim 3, wherein the distance between at least some of the printed circuit boards is set based on a distance between corresponding ends of the steps.

5. The camera module according to claim 2, wherein each of the steps has a quadrangular shape in section.

6. The camera module according to claim 1, wherein the first step is longer than the second step, and the second step is longer than the third step, in the longitudinal direction of the housing.

7. The camera module according to claim 6, wherein the printed circuit boards comprise:
 a first board disposed in the housing such that one surface of the first board contacts one end of the first step;
 a second board disposed in the housing such that one surface of the second board contacts one end of the second step;
 a third board disposed in the housing such that one surface of the third board contacts one end of the third step; and
 a fourth board disposed at the third step so as to be spaced apart from the third board in the longitudinal direction of the housing.

8. The camera module according to claim 7, wherein
 the first step is provided at one side thereof with a first protrusion, which is opposite the one end of the second step, for maintaining a state of contact between the one surface of the second board and the one end of the second step, and
 the first step or the second step is provided at one side thereof with a second protrusion, which is opposite the one end of the third step, for maintaining a state of contact between the one surface of the third board and the one end of the third step.

9. The camera module according to claim 8, wherein the first board is bonded to the one end of the first step.

10. The camera module according to claim 8, wherein
 the second board is coupled between the first protrusion and the one end of the second step by interference fitting, and
 the third board is coupled between the second protrusion and the one end of the third step by interference fitting.

11. The camera module according to claim 8, wherein
 the second board is coupled between the first protrusion and the one end of the second step by bonding, and
 the third board is coupled between the second protrusion and the one end of the third step by bonding.

12. The camera module according to claim 7, wherein the first board is provided with a through hole, through which a coupling member is inserted to couple the lens unit to the first board.

13. The camera module according to claim 7, wherein the third step is provided at one side thereof with a third protrusion, one surface of which contacts one surface of the fourth board.

14. The camera module according to claim 13, wherein the fourth board and the third protrusion are coupled to each other by bonding.

15. The camera module according to claim 1, wherein the steps are integrally formed on the inner wall of the housing.

16. The camera module according to claim 1, further comprising connectors for electrically interconnecting the printed circuit boards.

17. The camera module according to claim 1, wherein the steps are provided at diagonal positions of the inner wall of the housing when viewing a lateral section of the housing.

18. A camera module for automobiles comprising: a lens unit;
a housing, to a front of which the lens unit is coupled;
a plurality of printed circuit boards disposed in the housing so as to be opposite the lens unit;
a plurality of steps formed at an inner wall of the housing such that the steps are provided between the respective printed circuit boards so as to be spaced apart from each other for setting a distance between the respective printed circuit boards; and
a plurality of protrusions, each of the protrusions being opposite one end of a corresponding one of the steps, for maintaining a state of contact between one surface of each of the printed circuit boards and the one end of a corresponding one of the steps,
wherein the steps further comprise:
a first step;
a second step disposed at one side of the first step; and
a third step disposed at the other side of the first step such that the third step is perpendicular to the second step on a basis of the first step.

19. A camera module for automobiles comprising:
a lens unit;
a housing, to a front of which the lens unit is coupled;
a plurality of printed circuit boards disposed in the housing so as to be opposite the lens unit;
a plurality of steps formed at an inner wall of the housing such that the steps are provided between the respective printed circuit boards so as to be spaced apart from each other for setting a distance between the respective printed circuit boards; and
a plurality of protrusions, each of the protrusions being opposite one end of a corresponding one of the steps, for maintaining a state of contact between one surface of each of the printed circuit boards and the one end of a corresponding one of the steps,
wherein the steps further comprise:
a first step;
a second step disposed at one side of the first step; and
a third step disposed at the other side of the first step such that the third step is perpendicular to the second step on a basis of the first step,
wherein each of the printed circuit boards is provided at corners thereof at which the steps are not formed with depressions, and
the depressions comprise a pair of depressions provided at diagonal positions when viewing a lateral section of the housing.

* * * * *